(12) United States Patent
Okude

(10) Patent No.: US 6,700,456 B2
(45) Date of Patent: Mar. 2, 2004

(54) HIGH-FREQUENCY MODULE

(75) Inventor: Kouji Okude, Toyko (JP)

(73) Assignee: Honda elesys Co., Ltd., Tochigi (JP)

( * ) Notice: Subject to any disclaimer, the term of this patent is extended or adjusted under 35 U.S.C. 154(b) by 0 days.

(21) Appl. No.: 10/178,407

(22) Filed: Jun. 24, 2002

(65) Prior Publication Data

US 2002/0196097 A1 Dec. 26, 2002

(30) Foreign Application Priority Data

Jun. 25, 2001 (JP) .......................................... 2001-190570

(51) Int. Cl.$^7$ ................................................ H03H 5/00
(52) U.S. Cl. ............................................ 333/26; 333/24
(58) Field of Search .......................... 333/26, 247, 125, 333/21, 24

(56) References Cited

U.S. PATENT DOCUMENTS 5,225,797 A * 7/1993 Schary et al. ............... 333/125
6,239,669 B1 * 5/2001 Koriyama et al. ............ 333/26

* cited by examiner

*Primary Examiner*—Brian Young
*Assistant Examiner*—Joseph Lauture
(74) *Attorney, Agent, or Firm*—Scully, Scott, Murphy and Presser

(57) ABSTRACT

A high-frequency module of the present invention includes a laminate ceramic layer including a first layer smaller in area than the other layers. Parts constituting high-frequency circuitry are mounted on the laminate ceramic layer. A single interface substrate is juxtaposed to the first layer and connects the high-frequency circuitry and a waveguide. A metallic casing supports the laminate ceramic substrate and interface substrate with ground held in contact. The metallic casing is formed with at least one waveguide hole. A cover covers the waveguide hole and forms a waveguide end cavity. The interface substrate is positioned on the second layer of the laminate ceramic substrate, which just underlies the first layer, at one side and protrudes from the metallic casing into the waveguide hole at the other side.

11 Claims, 8 Drawing Sheets

HIGH-FREQUENCY MODULE

BACKGROUND OF THE INVENTION

1. Field of the Invention

The present invention relates to a high-frequency module constituting the center of, e.g., a milliwave radar mounted on a car and configured to interchange milliwaves with the outside of the car.

2. Description of the Background Art

Today, in the car electronics art, an operation support system for avoiding driver's human errors is attracting attention. The operation support system uses a laser radar mounted on a car for radiating a laser beam toward the front of the car. By reading the resulting reflected wave, the operation support system maintains, e.g., the running speed of the car and the distance between the car and a car running ahead for thereby avoiding driver's careless mistakes. The problem with the laser beam is that information being read is often effected by rain, fog and other weather conditions. In light of this, a milliwave ranging from 30 GHz to 40 GHz (international standard is 76.5 GHz) is recommended in place of the laser beam.

A high-frequency module, which constitutes the center of, e.g., a milliwave radar, generates a milliwave, radiates it to the outside via a waveguide, receives the resulting reflected wave from the outside, and calculates a difference between the frequency of the radiated wave and that of the received wave for thereby achieving the object. A conventional high-frequency module includes an MCM (Multi Chip Module) substrate or laminate ceramic substrate on which parts constituting high-frequency (microwave to milliwave) circuitry are mounted. Three interface substrates connect the high-frequency circuitry and waveguide. A metallic casing supports the MCM substrate and interface substrates and is formed with three waveguide holes. A cover covers the waveguide holes and forms a waveguide end cavity.

In the conventional high-frequency module described above, GND (ground) potential is connected between the MCM substrate and the interface substrates by way of GND connection wires and metallic casing, so that the microstrip line lacks continuity. As a result, if the MCM substrate and interface substrates are not accurately matched, then the characteristics of the module are degraded or the scatter is aggravated. This problem is aggravated because the plurality of interface substrates cause the positional accuracy of structural parts to critically effect the characteristics of the module, resulting in the scatter of the input and output characteristics of high-frequency signals.

Moreover, alumina-ceramic substrates constituting the interface substrates are not flexible and are therefore difficult to machine. This, coupled with the fact that the number of interface substrates is great, increases the number of assembling steps and therefore the production cost.

SUMMARY OF THE INVENTION

It is an object of the present invention to provide a high-frequency module capable of reducing the scatter of high-frequency characteristics to thereby stabilize the characteristics.

It is another object of the present invention to provide a high-frequency module capable of reducing the number of assembling steps and therefore cost.

A high-frequency module of the present invention includes a laminate ceramic layer including a first layer smaller in area than the other layers. Parts constituting high-frequency circuitry are mounted on the laminate ceramic layer. A single interface substrate is juxtaposed to the first layer and connects the high-frequency circuitry and a waveguide. A metallic casing supports the laminate ceramic substrate and interface substrate with ground held in contact. The metallic casing is formed with at least one waveguide hole. A cover covers the waveguide hole and forms a waveguide end cavity. The interface substrate is positioned on the second layer of the laminate ceramic substrate, which just underlies the first layer, at one side and protrudes from the metallic casing into the waveguide hole at the other side.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
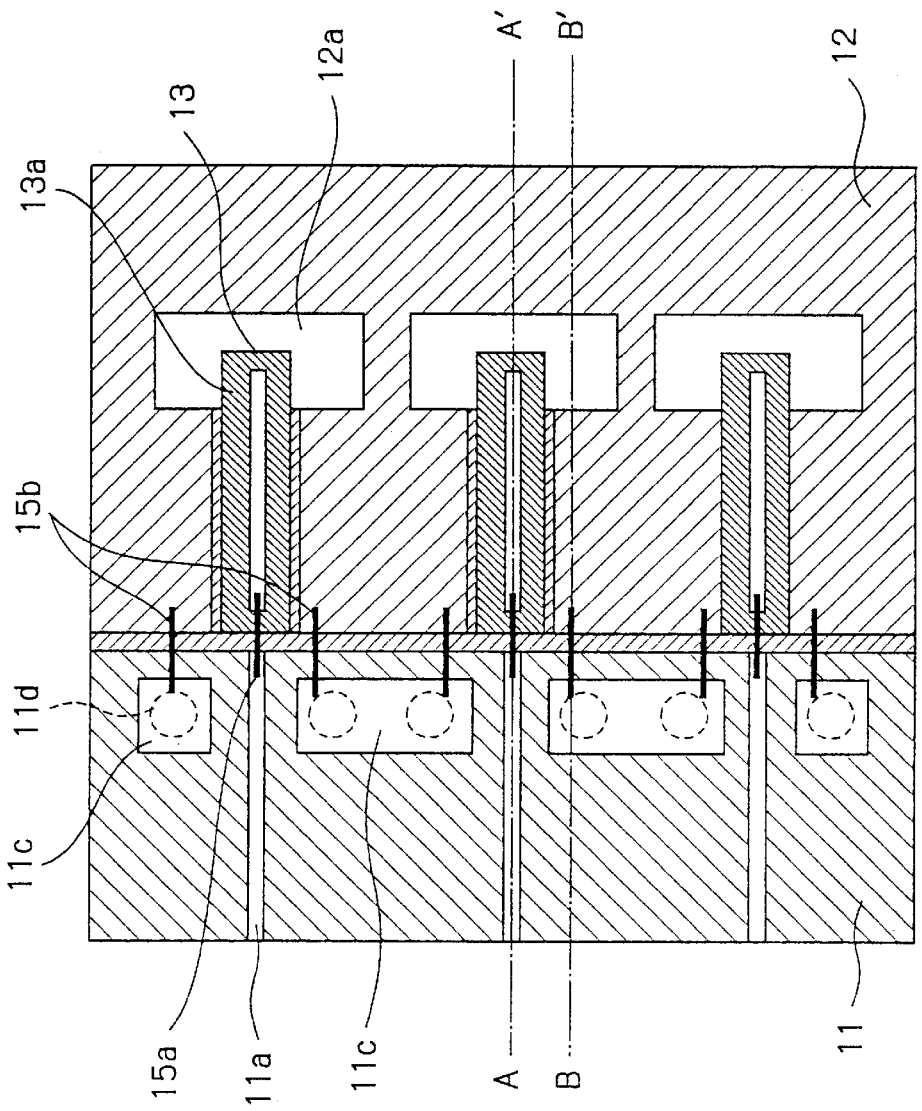
FIG. 1 is a plan view showing a conventional high-frequency module.
Figure 2:
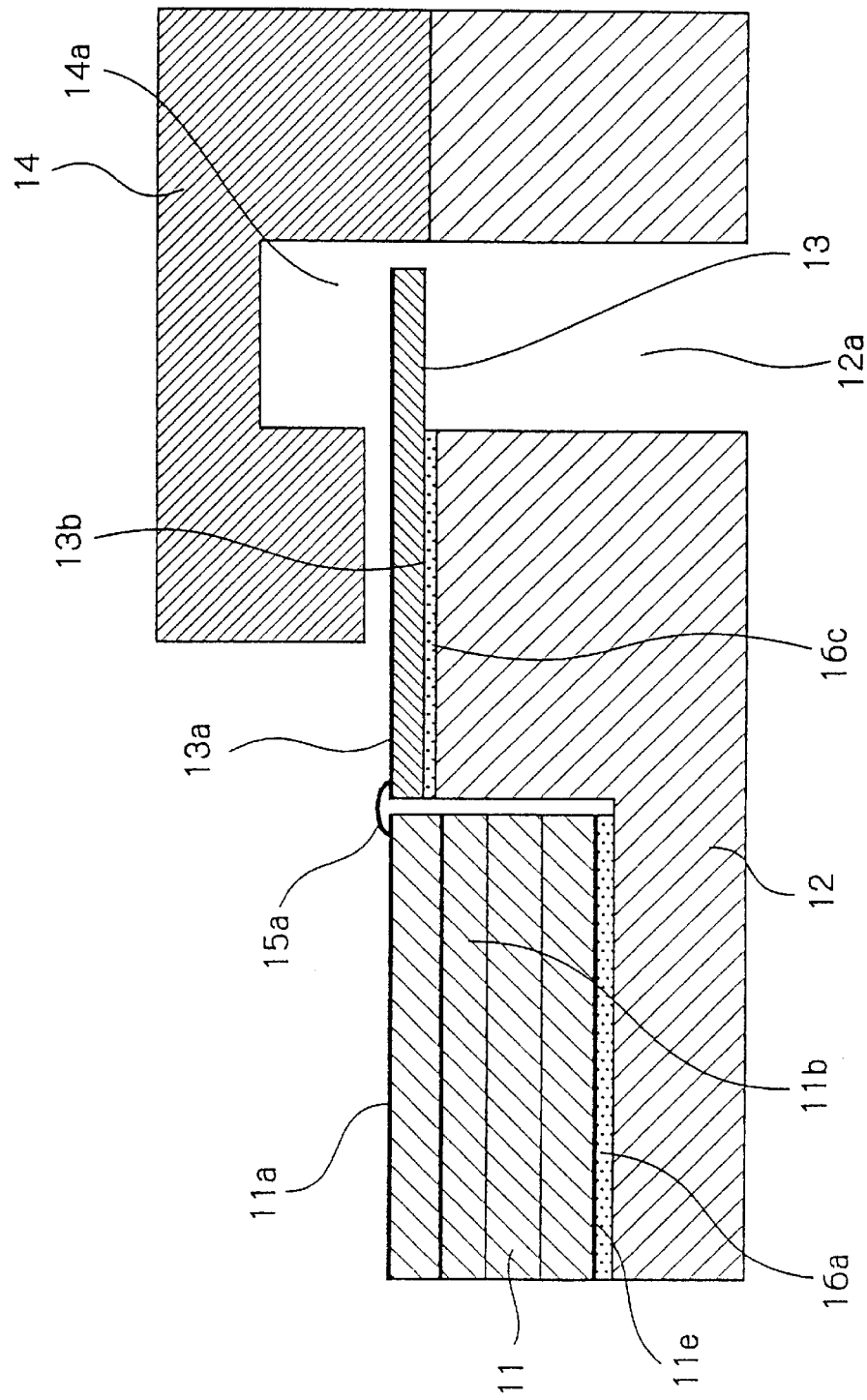
FIG. 2 is a section along line A–A' of FIG. 1.
Figure 3:
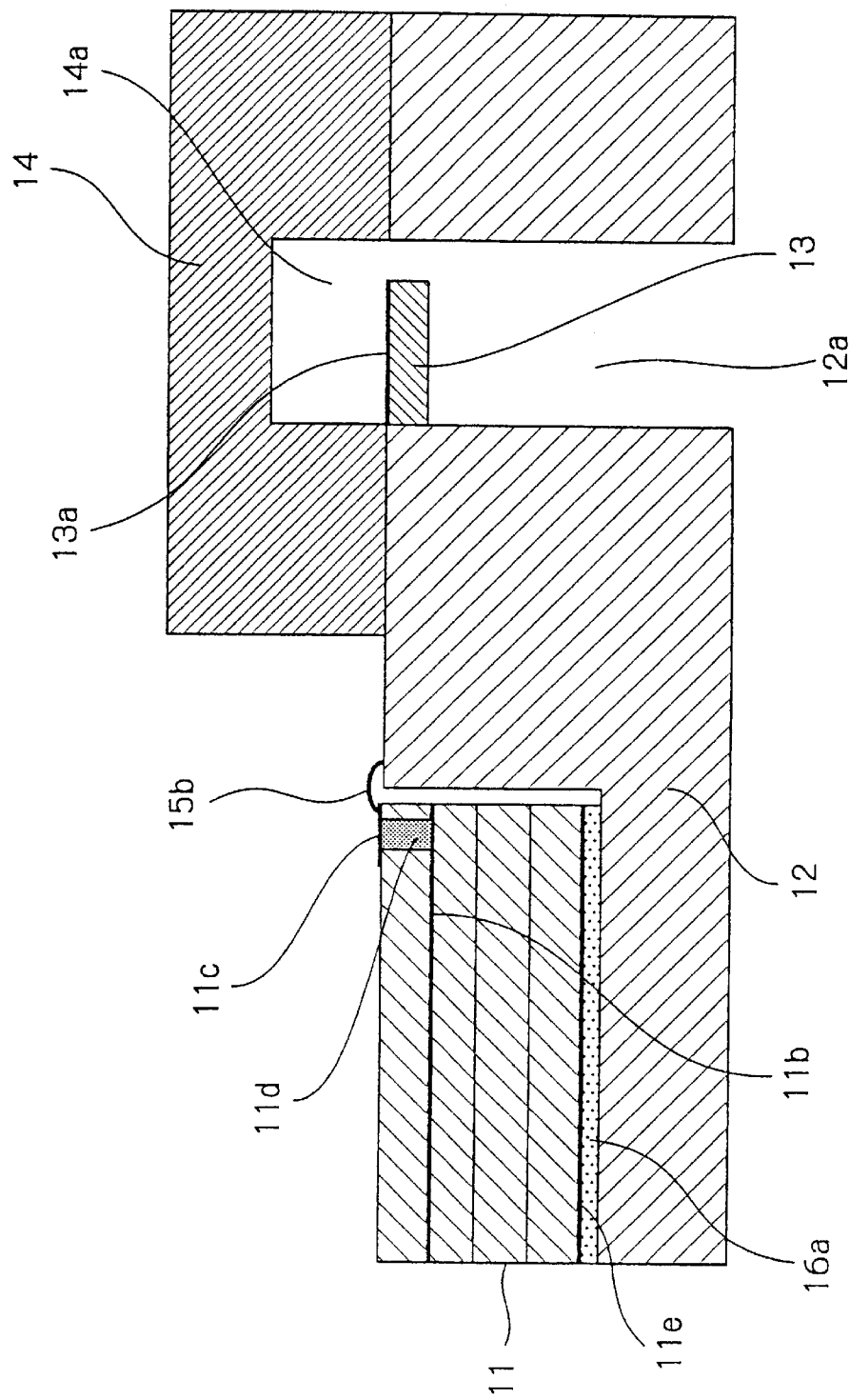
FIG. 3 is a section along line B–B' of FIG. 1.

To better understand the present invention, brief reference will be made to a conventional high-frequency module, shown in FIGS. 1 through 3. As shown, the high-frequency module includes an MCM substrate or laminate ceramic substrate 11 on which parts constituting high-frequency circuitry are mounted. Three interface substrates 13 connected the high-frequency circuit and a waveguide not shown. A metallic casing 12 supports the MCM substrate 11 and interface substrates 13 and is formed with three waveguide holes 12a. A cover 14 covers the waveguide holes 12a and forms a waveguide end cavity 14a. While the high-frequency module is shown as having three waveguide interfaces, the number of waveguide interfaces is not limited to three, but is dependent on desired radar performance.

The MCM substrate 11 has four layers all of which are cut in identical dimensions. As shown in FIGS. 2 and 3, the MCM substrate 11 is mounted on the top left portion of the metallic casing 12, which has a generally L-shaped section. The interface substrates 13 are mounted on the top right portion of casing 12, and each protrudes into adjoining one of the waveguide holes 12a at the right-hand side. The total thickness of the MCM substrate 11 and the left portion of the casing 12 and the total thickness of the casing 12 and each interface substrate 13 are substantially equal to each other, obviating a step between such two portions.

Three transmission line patterns 11a and four GND (ground) patterns 11c are formed on the top of the uppermost layer of the MCM substrate 11. A GND pattern 11b shared by the transmission line patterns 11a is formed over the entire interface between the uppermost layer of the MCM substrate 11 and the layer just underlying it. A ground pattern 11e is formed on the entire bottom of the lowermost layer of the MCM substrate 11 and identical in potential with the GND pattern 11b. A transmission line pattern 13a is formed on the top of each interface substrate 13 while a GND pattern 13b is formed on the entire bottom of each interface substrate 13. The transmission line patterns 11a each are connected to one of the transmission line patterns 13a by a particular signal line wire 15a.

An adhesive layer 16a intervenes between the bottom of the MCM substrate 11 and the casing 12. Likewise, an adhesive layer 16c intervenes between the bottom of each interface substrate 13 and the casing 12. For the adhesive layers 16a and 16c, use is made of conductive epoxy adhesive. In this configuration, the casing 12 connected to both of the bottom of the MCM substrate 11 and the bottoms of the interface substrates 13 is held at GND potential. To enhance GND with respect to high frequency, the GND pattern 11b in the MCM substrate 11 is connected to the GND patterns 11c on the MCM substrate 11 by via holes 11d. In addition, the GND patterns 11c are connected to the portion of the casing 12 supporting the interface substrates 13 by GND connection wires 15b.

As for the MCM substrate 11, the transmission line patterns 11a and GND pattern 11b constitute microstrip transmission circuitry. Likewise, as for the interface substrates 13, the transmission line patterns 13a and ground patterns 13b constitute microstrip transmission circuitry. The input or the output of high-frequency signals (waveguide interfaces) are propagated through the above microstrip transmission circuitry to the right ends of the interface substrates 13 and then to the waveguide connected to the waveguide holes 12a. Three high-frequency transmission lines each being made up of one transmission line pattern 11a, one transmission line pattern 13a and one waveguide hole 12a correspond to high frequencies for functioning as a milliwave radar.

Figure 4:
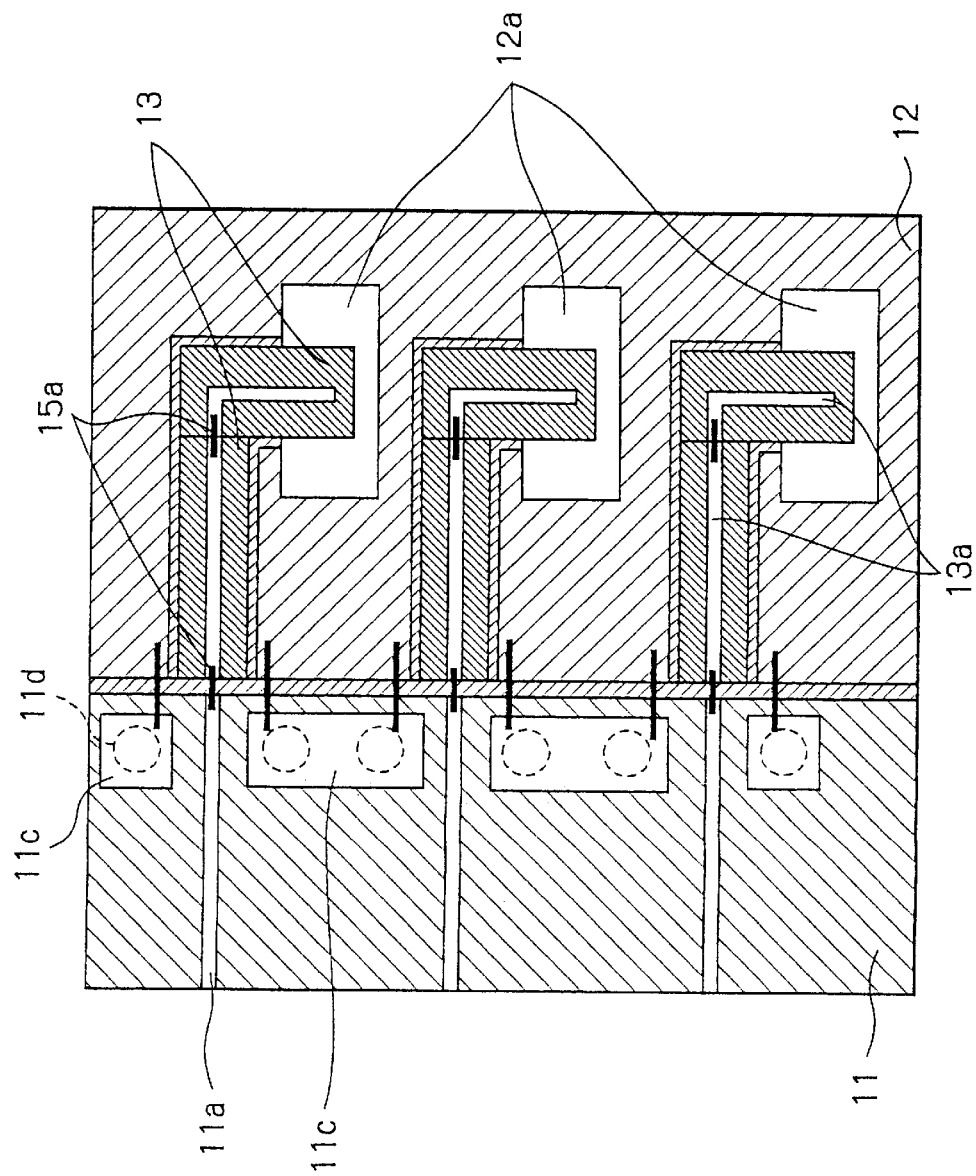
FIG. 4 is a plan view showing another conventional high-frequency module.

FIG. 4 shows another conventional high-frequency module. As shown, the waveguide holes 12a each are rotated by 90° from the position shown in FIG. 1. Each interface substrate 13 is made up of two parts connected together in the form of a letter L in accordance with the configuration of the waveguide hole 12a. The transmission line patterns 13a of the two parts of each interface substrate 13 are connected together by a signal line wire 15a. As for the rest of the construction, the module of FIG. 4 is identical with the module of FIGS. 1 through 3.

The conventional high-frequency modules described above have the following problems left unsolved. GND potential is connected between the MCM substrate 11 and the interface substrates 13 by way of the GND connection wires 15b and metallic casing 12, so that the microstrip line lacks continuity. As a result, if the MCM substrate and interface substrates 13 are not accurately matched, then the characteristics of the module are degraded or the scatter is aggravated. Moreover, alumina-ceramic substrates constituting the interface substrates 13 are not flexible and are therefore difficult to machine. This, coupled with the fact that the number of interface substrates 13 is great, increases the number of assembling steps and therefore the production cost, as stated earlier.

Briefly, a high-frequency module of the present invention includes an MCM substrate on which parts constituting high-frequency circuitry are mounted. A single interface substrate is juxtaposed to the uppermost layer or first layer of the MCM substrate and includes transmission line patterns connected to transmission line patterns that are formed on the first layer. The transmission line patterns of the interface substrate guide a high-frequency wave generated by the high-frequency circuitry to a waveguide while guiding a high-frequency wave input from the waveguide to the high-frequency circuitry. A GND pattern is formed on the interface substrate and contacts a GND pattern formed on the MCM substrate.

Figure 5:
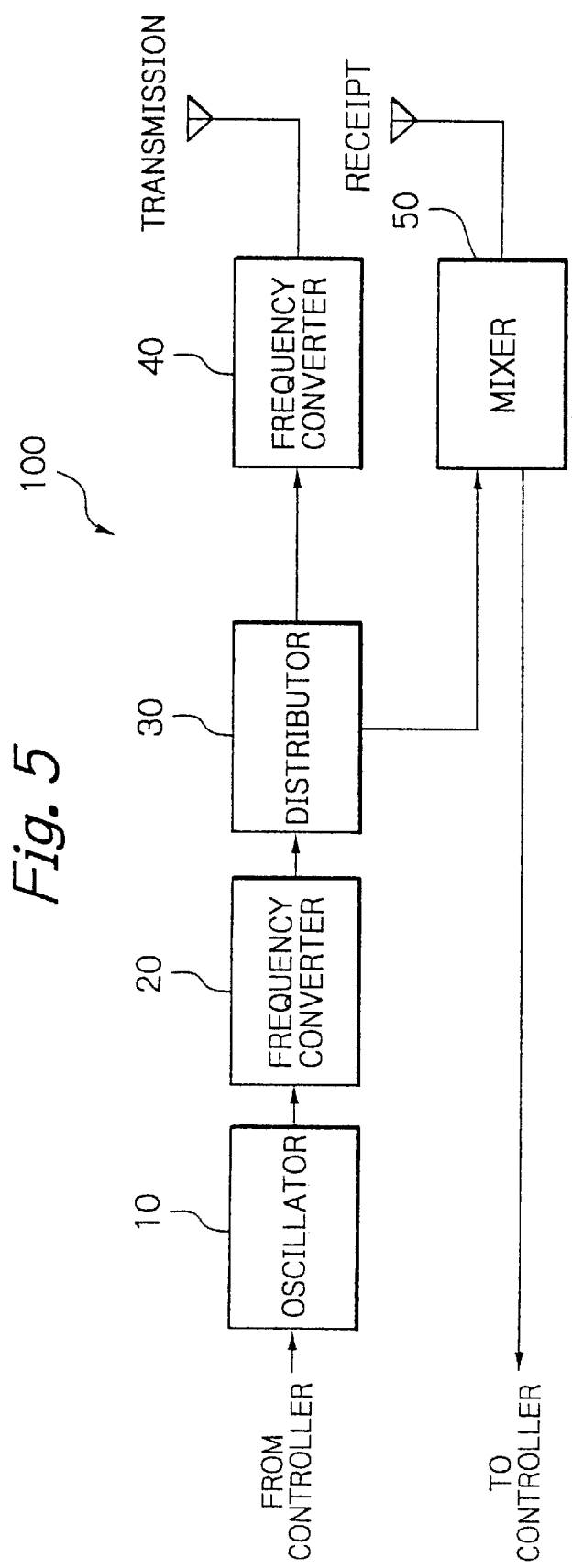
FIG. 5 is a block diagram showing the basic configuration of an MCM included in a milliwave radar to which the present invention is applicable.

Reference will be made to FIG. 5 for describing a milliwave radar to which the present invention is applicable. FIG. 5 shows an MCM 100 constituting the center of an on-board milliwave radar mounted on a car. The MCM 100 radiates a beat signal to the outside, receives the resulting reflected wave, and calculates a difference between the frequency of the transmitted signal and that of the received signal for thereby reading information in front of the car. The beam signal has a frequency modulated within the range of about 75 MHz at both sides of 76.5 GHz (international standard).

As shown in FIG. 5, the MCM 100 includes an oscillator 10 outputting a milliwave at preselected intervals. A frequency converter 20 converts the frequency of the milliwave and feeds the converted milliwave to a distributor 30. The distributor 30 distributes the milliwave to a frequency converter 40 and a mixer 50 included in a transmission circuit and a receipt circuit, respectively. The frequency converter 40 converts the frequency of the milliwave to about 76.5 GHz and then radiates it to the outside. The resulting reflected wave is input to the mixer 50. The mixer 50 produces a difference between the milliwave frequency input from the distributor 30 and the frequency of the reflected wave and sends the difference to a controller not shown. The controller recognizes information in front of the car, e.g., a distance between the car and a car running ahead on the basis of the above difference.

Figure 6:
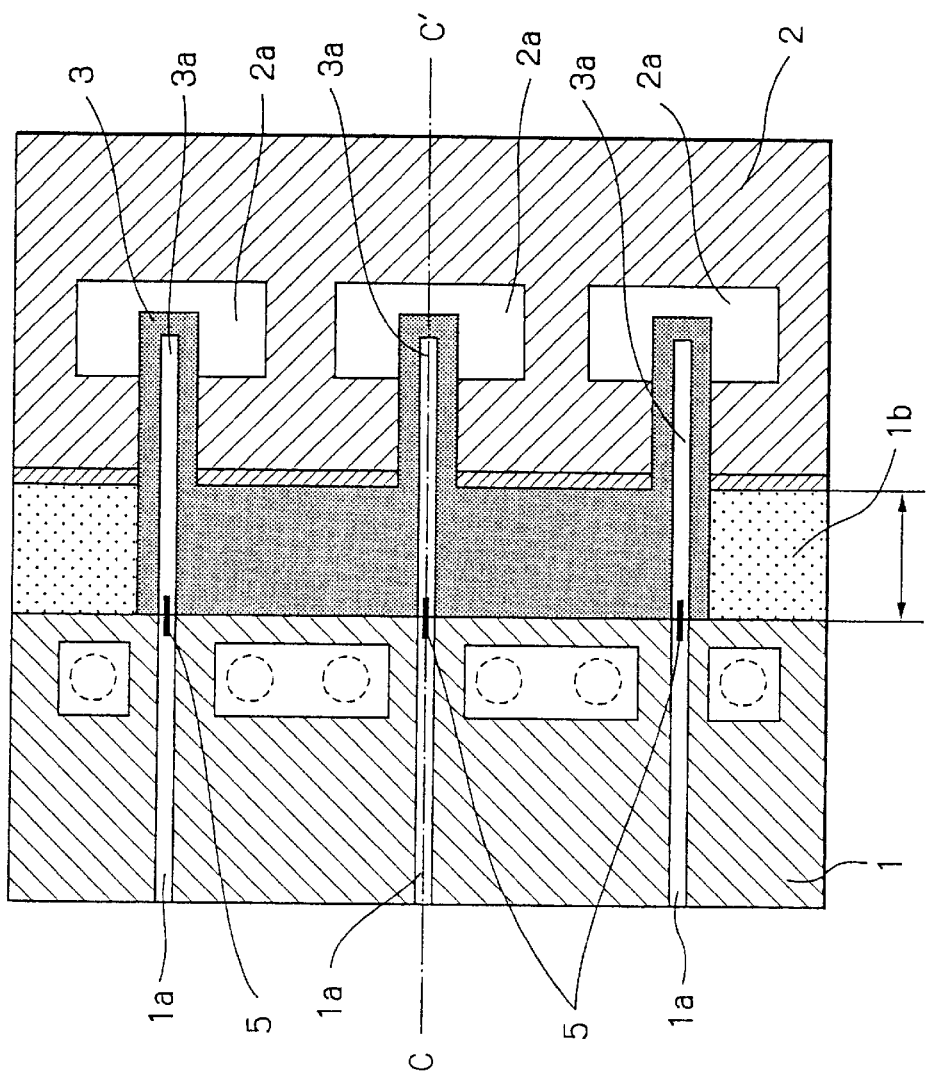
FIG. 6 is a plan view showing a high-frequency module embodying the present invention.
Figure 7:
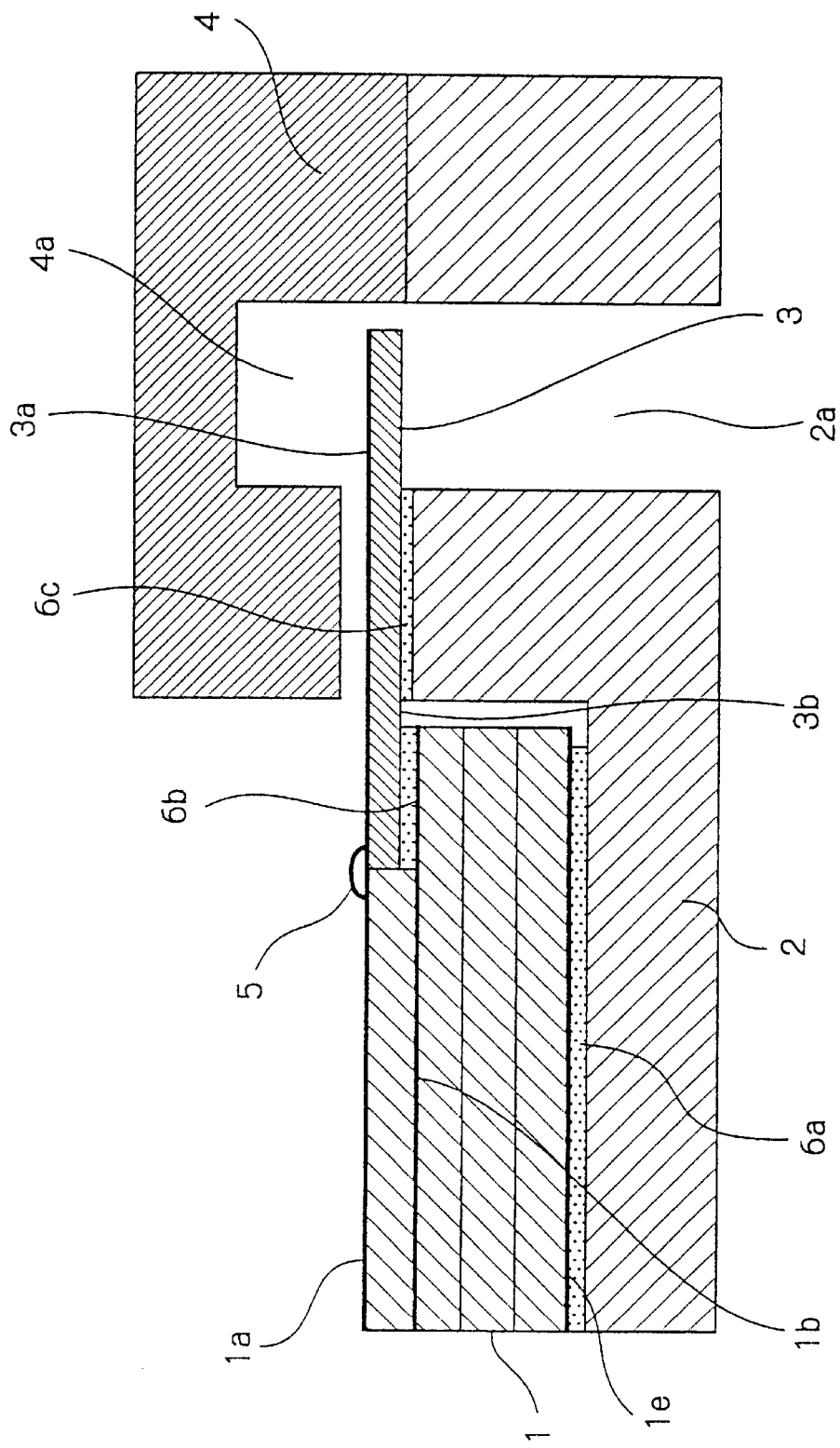
FIG. 7 is a section along line C–C' of FIG. 2.
Figure 8:
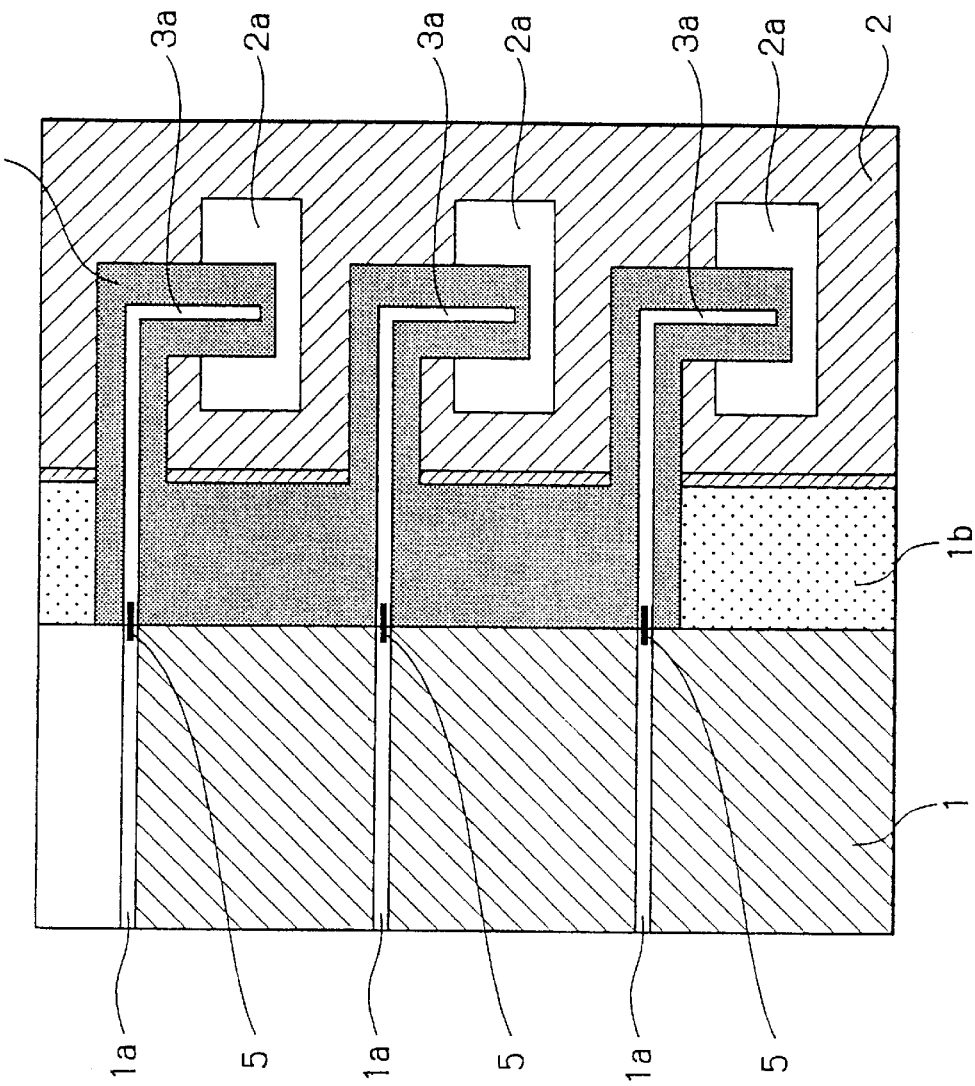
FIG. 8 is a plan view showing an alternative embodiment of the present invention.

Referring to FIGS. 6 and 7, a high-frequency module embodying the present invention and implementing the MCM 100, FIG. 5, is shown. The illustrative embodiment constitutes an improvement over the conventional high-frequency module described with reference to FIGS. 1 through 3. As shown, the high-frequency module includes an MCM substrate 1 on which parts constituting high-frequency (microwave and milliwave) circuitry are mounted. A single interface substrate 3 connects the high-frequency circuit and a waveguide not shown. A metallic casing 2 supports the MCM substrate 1 and interface substrate 3 and is formed with three waveguide holes 2a. A cover 4 covers the waveguide holes 2a and forms a waveguide end cavity 4a.

The three waveguide holes 2a formed in the casing 2 constitute waveguide interfaces. The interface substrate 3 transfers a high-frequency signal input from the MCM substrate 1 and converts it to a waveguide mode.

The MCM substrate 1 is a laminate of four layers cut in identical dimensions except for the uppermost layer. As shown in FIG. 7, the MCM substrate 1 is mounted on the top left portion of the generally L-shaped casing 2 while the intermediate portion of the interface substrate 3 is mounted on the top right portion of the casing 2. The left portion of the interface substrate 3 is positioned on a second layer just underlying the uppermost layer or first layer. The right portion of the interface substrate 3 protrudes into the waveguide holes 2a over the right edge of the casing 2. The total thickness of the uppermost layer to the lowermost or fourth layer of the MCM substrate 1 and the left portion of the casing 2 is equal to the total thickness of the interface substrate 3, the second to fourth layer and the left portion of the casing 2, so that steps do not appear at the above three positions. This can be done if the interface substrate 3 is formed of PTFE (polytetrafluoroethylene) or similar flexible material. Considering the machining accuracy of the casing 2 and the allowances of the MCM substrate 1 and interface substrate 3, the flexibility of such a substance should only be great enough to absorb the maximum step of 100 μm.

Three transmission line patterns 1a are formed on the top of the uppermost layer or first layer of the MCM substrate 1. A GND pattern 1b is formed between the first layer and a second layer just underlying the first layer up to the extended end of the second layer, i.e., up to the end of the MCM substrate 1. A GND pattern 1e identical in potential with the GND pattern 1b is formed on the entire bottom of the lowermost layer of the MCM substrate 1. Three transmission line patterns 3a are formed on the top of the interface substrate 3 while a GND pattern 3b is formed on the entire bottom of the interface substrate 3. The transmission line patterns 1a on the MCM 1 each are connected to one of the transmission line patterns 3a on the interface substrate 3 by a particular signal line wire 5. In the illustrative embodiment, the interface substrate 3 is generally E-shaped, as seen in a plan view, connecting the three interface substrates 13 shown in FIG. 1. This configuration allows the three transmission line patterns 1a and three transmission line patterns 3a to be easily connected by use of the signal line wires 5.

Adhesive layers 6a and 6b respectively intervene between the bottom of the MCM substrate 1 and the casing 2 and between the bottom of the interface substrate 3 and the second layer of the MCM substrate 1. Further, an adhesive layer 6c intervenes between the bottom of the interface substrate 3 and the casing 2. The adhesive layers 6a through 6c are implemented by conductive epoxy adhesive.

As shown in FIG. 7, the second to fourth layers of the MCM substrate 1 are greater in area than the first or uppermost layer and extended to a position beneath the cover 4. Therefore, the width of the generally L-shaped casing 2 is reduced with the result that the left portion of the interface substrate 3 is positioned on the top of the second layer. In this configuration, the GND pattern 1b of the MCM substrate 1 and the GND pattern 3b of the interface substrate 3 contact each other on the top of the second layer via the adhesive layer 6b. The illustrative embodiment therefore obviates the need for the GND patterns 11c, via holes 11d and GND connection wires 15b, FIGS. 1 and 4, heretofore used to enhance GND, thereby reducing the number of parts necessary for the high-frequency module.

The transmission line patterns 1a and GND pattern 1b included in the MCM substrate 1 form microstrip transmission circuitry. Likewise, the transmission line patterns 3a and transmission line GND pattern 3b included in the interface substrate 3 form microstrip transmission circuitry. Such microstrip transmission circuitry extends from the left end of the MCM substrate 1 to the right end of the generally L-shaped casing 2. The input or the output of a high-frequency signal (waveguide interface) is propagated through each microstrip transmission circuitry to the right end of the interface substrate 3 and then input to a waveguide, not shown, inserted in a particular waveguide hole 2a.

FIG. 7 shows an alternative embodiment of the present invention that constitutes an improvement over the conventional high-frequency module shown in FIG. 4. As shown, each waveguide hole 2a is rotated by 90° from the position shown in FIG. 6. In addition, the right end of the interface substrate 3 is bent in accordance with the configuration of the waveguide holes 2a such that the transmission line patterns 3a on the substrate 3 extend to the holes 2a. As for the rest of the construction, the illustrative embodiment is identical with the embodiment described with reference to FIGS. 6 and 5. The interface substrate 3 with such a sophisticated configuration can be integrally machined because it is formed of PTFE or similar flexible material.

In the embodiments shown and described, the signal line wires 5 may be replaced with ribbon wires, if desired. Also, the conductive epoxy adhesive forming the adhesive layers 6a through 6c may be replaced with hard solder that solders the MCM substrate 1, interface substrate 3, and metallic casing 2. Further, a coplanar transmission circuitry may be substituted for the microstrip transmission lines.

In summary, a high-frequency module of the present invention reduces the scatter of high-frequency characteristics to thereby make the characteristics stable. Experiments using a five-waveguide configuration showed that the module of the present invention reduced the conventional scatter of ±1 decibel to ±0.3 decibel, i.e., to one-third of the conventional scatter. More specifically, the assembling accuracy of structural parts is generally the major cause of the scatter of the high-frequency (particularly microwave to milliwave) characteristics. In this respect, the module of the present invention includes only a single interface substrate to thereby reduce the scatter of assembly. In addition, an MCM substrate and a GND pattern formed on the interface substrate contact each other, providing the GND surfaces of microstrip transmission lines with continuity and thereby stabilizing matching of the transmission lines.

Moreover, the interface substrate of the present invention is formed of a flexible material and can therefore be easily configured as a single member. This successfully reduces the number of parts and therefore the number of assembling steps to a noticeable degree while reducing the unit part cost and therefore the total cost of the module.

Various modifications will become possible for those skilled in the art after receiving the teachings of the present disclosure without departing from the scope thereof.

What is claimed is:

1. A high-frequency module comprising:
   a laminate ceramic layer including a first layer smaller in area than other layers, parts constituting high-frequency circuitry being mounted on said laminate ceramic layer;
   an interface substrate juxtaposed to said first layer and connecting said high-frequency circuitry and a waveguide;
   a metallic casing supporting said laminate ceramic substrate and said interface substrate with ground held in contact, said metallic casing being formed with at least one waveguide hole; and
   a cover covering said waveguide hole and forming a waveguide end cavity;
   wherein said interface substrate is positioned on a second layer of said laminate ceramic substrate, which just underlies said first layer, at one side and protrudes from said metallic casing into said waveguide hole at the other side,
   a high-frequency wave generated by said high-frequency circuitry is guided to said waveguide by a transmission line pattern formed on said interface substrate connected to a transmission line pattern of said laminate ceramic substrate corresponding to said waveguide hole, while a high-frequency wave input from said waveguide is guided to said high-frequency circuitry by said transmission line pattern of said interface substrate, and a GND pattern formed on the one side of said interface substrate contacts a GND pattern formed on a top of said second layer.

2. The module as claimed in claim 1, wherein said transmission line pattern and said GND pattern of said laminate ceramic substrate and said transmission line pattern and said GND pattern of said interface substrate constitute a single microstrip transmission line.

3. The module as claimed in claim 1, wherein said transmission pattern of said interface substrate is freely configured in accordance with at least one of a position and a shape of said waveguide hole.

4. The module as claimed in claim 3, wherein said transmission line pattern and said GND pattern of said laminate ceramic substrate and said transmission line pattern and said GND pattern of said interface substrate constitute a single microstrip transmission line.

5. The module as claimed in claim 1, wherein said interface substrate is flexible enough to absorb a step between the top of said second layer and a top of said metallic casing contacting said interface substrate.

6. The module as claimed in claim 5, wherein said transmission pattern of said interface substrate is freely configured in accordance with at least one of a position and a shape of said waveguide hole.

7. The module as claimed in claim 6, wherein said transmission line pattern and said GND pattern of said laminate ceramic substrate and said transmission line pattern and said GND pattern of said interface substrate constitute a single microstrip transmission line.

8. The module as claimed in claim 1, wherein said interface substrate is formed of PTFE (polytetrafluoroethylene).

9. The module as claimed in claim 8, wherein said interface substrate is flexible enough to absorb a step between the top of said second layer and a top of said metallic casing contacting said interface substrate.

10. The module as claimed in claim 9, wherein said transmission pattern of said interface substrate is freely configured in accordance with at least one of a position and a shape of said waveguide hole.

11. The module as claimed in claim 10, wherein said transmission line pattern and said GND pattern of said laminate ceramic substrate and said transmission line pattern and said GND pattern of said interface substrate constitute a single microstrip transmission line.

* * * * *